US011988689B2

(12) United States Patent
Boury et al.

(10) Patent No.: US 11,988,689 B2
(45) Date of Patent: *May 21, 2024

(54) INSULATED CURRENT SENSOR

(71) Applicant: Melexis Technologies SA, Bevaix (CH)

(72) Inventors: Bruno Boury, Tessenderlo (BE);
Robert Racz, Bevaix (CH); Antonio Cacciato, Tessenderlo (BE); Jian Chen, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/974,869

(22) Filed: Oct. 27, 2022

(65) Prior Publication Data

US 2023/0049864 A1 Feb. 16, 2023

Related U.S. Application Data

(63) Continuation of application No. 16/662,378, filed on Oct. 24, 2019, now Pat. No. 11,506,688.

(30) Foreign Application Priority Data

Oct. 24, 2018 (EP) ..................................... 18202389

(51) Int. Cl.
*G01R 15/14* (2006.01)
*H10N 52/00* (2023.01)
*H10N 52/01* (2023.01)
*H10N 52/80* (2023.01)

(52) U.S. Cl.
CPC .......... *G01R 15/148* (2013.01); *H10N 52/01* (2023.02); *H10N 52/101* (2023.02); *H10N 52/80* (2023.02)

(58) Field of Classification Search
CPC .... G01R 15/148; G01R 15/207; H10N 52/01; H10N 52/101; H10N 52/80
See application file for complete search history.

(56) References Cited

U.S. PATENT DOCUMENTS

| 9,222,992 B2 | 12/2015 | Ausserlechner et al. |
| 9,958,482 B1* | 5/2018 | Latham ................ G01R 15/205 |
| 10,352,969 B2 | 7/2019 | Milano et al. |

(Continued)

FOREIGN PATENT DOCUMENTS

| DE | 19819470 A1 | 7/1999 |
| EP | 3327449 A1 | 5/2018 |

OTHER PUBLICATIONS

European Search Report from corresponding EP Application No. EP18202389, dated Apr. 18, 2019.

*Primary Examiner* — Dominic E Hawkins
(74) *Attorney, Agent, or Firm* — Workman Nydegger

(57) ABSTRACT

A circuit for sensing a current comprises a substrate having a first and a second major surface, the second major surface being opposite to the first major surface. At least one magnetic field sensing element is arranged on the first major surface of the substrate and is suitable for sensing a magnetic field caused by a current flow in a current conductor coupled to the second major surface. The substrate also comprises at least one insulation layer, substantially buried between the first major surface and the second major surface of the substrate.

9 Claims, 3 Drawing Sheets

(56) References Cited

U.S. PATENT DOCUMENTS

| | | | | |
|---|---|---|---|---|
| 2003/0003739 A1* | 1/2003 | Butschke | ............... | G03F 1/80 |
| | | | | 438/689 |
| 2006/0255797 A1* | 11/2006 | Taylor | ............... | G01R 15/207 |
| | | | | 324/262 |
| 2012/0049304 A1 | 3/2012 | Motz et al. | | |
| 2016/0299200 A1 | 10/2016 | Taylor et al. | | |
| 2017/0322237 A1 | 11/2017 | Hanley et al. | | |
| 2018/0149677 A1* | 5/2018 | Milano | ............... | G01R 15/148 |

* cited by examiner

INSULATED CURRENT SENSOR

FIELD OF THE INVENTION

The present invention generally relates to current sensing devices and methods for manufacturing thereof, and, more particularly, relates to current sensing devices that are suitable for high current sensing applications.

BACKGROUND OF THE INVENTION

Integrated circuits for measuring a current by means of sensing a magnetic field generated by a current flow are known in the field. An advancing degree of device miniaturization and cost reduction, however, leads to increased current densities, related ohmic losses, and heat dissipation that require careful consideration of the circuit design on the one hand and a good trade-off between maximization of the sensed magnetic field strength and sufficient voltage insulation between the current carrying conductor and the sensing circuitry, as well as connected external circuitry, on the other hand.

Both flip-chip assemblies implementing insulation barriers in a wafer postprocessing step and die-up configurations with insulation barriers have been described in prior art. The former solution needs a specifically conceived redistribution layer to connect to the input and output connectors of the die to the pins of the package. Very thin lead fingers are required for a good input/output count, hence a custom leadframe design and an extra etching step are provided for this approach, and a careful alignment of fingers belonging to a secondary portion of the leadframe with respect to the flipped die establishes the electrical coupling between die and leadframe. The latter solution is more flexible having regard to the assembly of leadframe and die as wire bonding techniques can be used, but the signal weakness at the sensing element is a disadvantage of die-up configurations. Good voltage insulation can be achieved with ceramic interposers as insulation barriers, but these are not readily available during wafer postprocessing but are provided only during assembly. Therefore, there is a need for integrated current sensing circuits that provide good voltage insulation and signal strength, without adding additional assembly steps.

SUMMARY OF THE INVENTION

It is an object of embodiments of the present invention to provide a reliable current sensing device suitable for sensing high currents of up to at least 150 A (rms) and 200 A (peak) while withstanding and insulating voltages up to at least 3 kV, and a method for manufacturing such current sensing device.

The above objective is accomplished by a device and method in accordance with embodiments of the present invention.

In a first aspect, the present invention provides a circuit, e.g. an integrated circuit, for sensing current. The circuit comprises:
- a substrate having a first and a second major surface, the second major surface being opposite to the first major surface;
- at least one magnetic field sensing element arranged on said first major surface of the substrate and suitable for sensing a magnetic field caused by a current flow in a current conductor coupled to the second major surface;

wherein the substrate comprises a first insulation layer positioned between the first major surface and the second major surface such that it is substantially buried in the substrate. With the first insulation layer being substantially buried in the substrate is meant that most, e.g. more than 60%, more than 80%, more than 90% or all of its outward directed substance is interfacing a substrate material. In embodiments of the present invention, the first insulation layer may be completely buried in the substrate.

The first insulation layer may be fabricated during a wafer process, hence a cost-effective, reliable, and scalable, buried layer with high quality may be obtained. The first insulation layer can be thin. The required thickness of the buried insulation layer depends on the voltages that will be applied and may correspond to about 1 µm per 500V. Hence for applications of about 2 kV, the insulation layer thickness can be about 4 µm, but for applications up to 60V much lower insulation layer thicknesses are needed. No extra die attach layer for an interposer is required. Advantageously, strong currents are measurable at low risk.

In embodiments of the present invention, the at least one first insulation layer may be a buried insulating oxide layer or a buried insulating nitride layer. Silicon oxide, for example, has very good insulating properties. A nitride passivation layer also has good insulating properties, and moreover is good for moisture protection.

In a circuit according to embodiments of the present invention, the substrate may be an integrated sensor die.

In a circuit according to embodiments of the present invention, substrate material on either side of the first insulation layer may be a semiconductor material. In particular embodiments, the substrate may be a semiconductor-insulator-semiconductor (SOI) substrate, e.g. a silicon-insulator-silicon substrate, wherein the insulator forms the first insulation layer. It is an advantage to use such substrate, as semiconductor on insulator processing, e.g. silicon on insulator processing, is a mature technique.

In a particular configuration, the SOI substrate may comprise a semiconductor layer, a buried insulation layer and an EPI layer. In the EPI layer, at least two Hall plates, or at least two groups of Hall plates with their outputs connected in parallel, may be provided as magnetic field sensing element.

In embodiments of the present invention, the SOI substrate may be coupled to a reference potential, e.g. may be grounded, for instance by making use of a through-substrate via (TSV).

A circuit according to embodiments of the present invention may further comprise an external insulation layer positioned between the second major surface and the current conductor. For instance, in case of an SOI substrate as indicated above, an external insulation layer, for instance a voltage insulation tape, may be provided between the semiconductor layer of the SOI substrate and the current conductor. Such external insulation layer provides an additional protection for high current applications. Furthermore, such external insulation layer forms a second reinforcement layer. It can be deposited on the substrate or on the leadframe, or it can be placed in between both, e.g. by attachment layers.

A circuit according to embodiments of the present invention may for instance comprise an insulating tape coupled to the second major surface of the substrate. This insulating tape may be used to physically attach the substrate to a current conductor, such as for instance to the leadframe.

A circuit according to embodiments of the present invention may further comprise a leadframe comprising a primary and a secondary portion, the primary and secondary portion each comprising a plurality of leads, wherein at least two of the leads of the primary portion of the leadframe are electrically connected to each other to form a current conductor. Many leads may be connected to support current to be measured, thus wider connection pads may be obtained, having lower resistivity and less heat dissipation.

In such a circuit according to embodiments of the present invention, at least two magnetic field sensing elements may be provided, at least one at each side of the current conductor, to measure the magnetic field. These sensors are advantageously used in inverted polarity so that an external magnetic field may be cancelled out.

In a circuit according to embodiments of the present invention, a thickness of the substrate may be reduced in the vicinity of the at least one magnetic field sensing element. Reducing the substrate thickness decreases the distance between the current conductor and the sensing element for increasing sensor sensitivity, for instance for obtaining better SNR.

In a circuit according to embodiments of the present invention, a cavity may be formed at the second major surface and in the vicinity of the at least one magnetic field sensing element. This way, a locally thin membrane may be formed for even more reduced distance and better sensitivity, without, however, losing structural support. The cavity may comprise chamfered side walls and/or straight side walls. The cavity may lock the conductor in place when aligning the leadframe with the substrate, without damaging the membrane.

In a circuit according to embodiments of the present invention, the first insulation layer may be partially exposed at the second major surface. This may be obtained by removing all the extra substrate at the backside, even if wafer is already thinned.

In particular embodiments of the present invention, both with SOI-types of substrate or with other substrates, the current conductor may comprise a flat section and a protruding section, the flat section extending in a plane parallel to the second major surface, and the protruding section extending out of said plane and into the cavity. Such conductor geometry enables a closer placement of the conductor and the sensing element. It is easily obtainable by deformation or stamping.

In a circuit according to particular embodiments of the present invention, the die only overlaps the primary portion of the leadframe in a plan view parallel to the first major surface. This means that the substrate may be resting only on the primary portion of the leadframe, without overlapping the secondary portion of the leadframe in a plan view parallel to the first major surface. This configuration enables smaller dies resting on the primary leadframe portion, thus smaller cost per die. Furthermore, longer primary/secondary distances are possible, which provides better insulation.

In a circuit according to embodiments of the present invention, the at least one magnetic field sensing element may be electrically coupled to the secondary portion of the leadframe, for instance via wire bonding. Wire bonding is a more flexible process than vias: wires are easier to place and assemble, the alignment tolerance is much more relaxed, longer wires are available, and less die processing steps are required.

In a circuit according to embodiments of the present invention, the substrate may further comprise at least one second insulation layer positioned between the first major surface and the second major surface, such that it is buried in the substrate and not touching the first insulation layer. This way increased insulating properties are obtained, for instance for high current applications and/or operating voltages/spikes. A substrate material located between the first insulation layer and the second insulation layer may be electrically grounded. This grounded substrate material then forms an electrostatic shield, which avoids capacitive coupling of dV/dt transients from the primary conductor.

In a circuit according to embodiments of the present invention, the substrate may further comprise an insulating circumferential wall adjacent to its rim, the insulating wall extending transversely from the first insulation layer.

A circuit according to embodiments of the present invention may further comprise at least one flux concentrating magnetic layer arranged on the first major surface. This allows a local concentration of magnetic field lines, and thus a better sensitivity and SNR.

In a circuit according to embodiments of the present invention, the at least one magnetic field sensing element may be implemented in a foreign material which is electrically connected to the semiconductor material of the substrate. This way, high responsivity materials may be used for the sensing element.

In a circuit according to embodiments of the present invention, the at least one magnetic field sensing element may be a printed magnetic field sensing element. This is an easy and low-cost method for integration of magnetic field sensing elements.

A circuit according to embodiments of the present invention may form an integrated current sensor, whereby for instance all bits and pieces of the circuit are over-moulded in a single package.

In a second aspect, the present invention provides a method of manufacturing a device for measuring a current. The method comprises:

providing a semiconductor substrate having a first and a second major surface, the second major surface being opposite to said first major surface, and a first insulation layer which is, over at least part of its surface, buried in the substrate between said first and second major surface; and providing at least one magnetic field sensing element on the first major surface, the magnetic field sensing element being suitable for sensing current flowing through a current conductor physically coupled to the second major surface.

A method according to embodiments of the present invention may further comprise providing a current conductor and physically coupling the current conductor to the second major surface.

In a method according to embodiments of the present invention, providing a current conductor may comprise:

providing a flat leadframe including a plurality of leads, of which at least two leads are connected so as to form said current conductor as a flat current conductor; and etching a portion of the flat current conductor and/or using a stamping tool to form a protruding section along the flat current conductor.

It is an advantage of this embodiment that the leadframe can be thick for better etching results.

A method according to embodiments of the present invention may further comprise the step of etching a cavity into the semiconductor substrate, the cavity being etched at the second major surface and in the vicinity of the at least one magnetic field sensing element. In accordance with embodiments of the present invention, etching can be wet or dry etching for controlling a side wall angle of the cavity. A method according to embodiments of the present invention may further comprise the step of filling the cavity with a low partial discharge susceptible silicone gel. The silicone may act as a sealing agent, as a thermal and electrical insulator, and/or as an adhesive.

In a method according to embodiments of the present invention, coupling said current conductor to the second major surface may include applying a conductive paste between the current conductor and the second major surface. This may provide improved adhesion, less heat, and/or a more uniform current flow at target distance.

A method according to embodiments of the present invention may further comprise the step of applying, at a predetermined distance from the rim of the semiconductor substrate, a deep trench insulation process to the semiconductor substrate. This provides better intrinsic insulation with respect to other circuitry, thus enabling formation of a larger and/or more powerful device.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
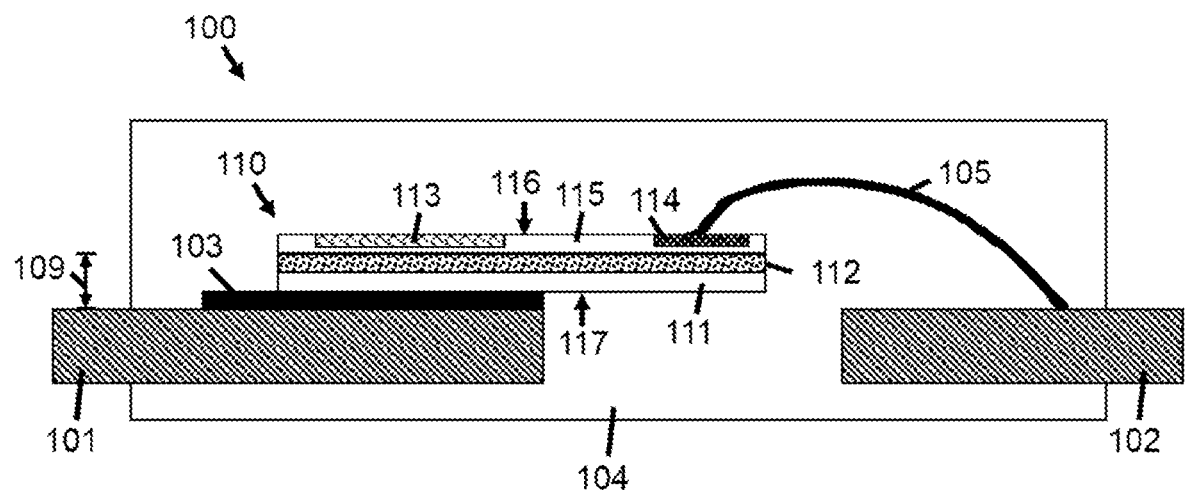
FIG. 1 shows a schematic cross-sectional view of a circuit suitable for sensing a current in accordance with an embodiment of the invention.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, directional terminology such as top, bottom, front, back, under, over and the like in the description and the claims is used for descriptive purposes with reference to the orientation of the drawings being described, and not necessarily for describing relative positions. Because components of embodiments of the present invention can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

A component or element arranged, provided, or formed on a surface, e.g. an electronic element arranged or formed on a substrate surface, may either be arranged, provided, or formed on top of that surface, the surface being a support for the component or element, or may be arranged, provided, or formed in such a way that it is in contact with that surface and is part of that surface but can, at the same time, extend into regions immediately below or above that surface.

In the context of the present invention, an insulation layer is considered substantially buried in a substrate if most of its outward directed substance is interfacing a substrate material. This includes two cases: a first one in which an insulation layer is completely buried in a substrate, meaning that all of its outward directed substance is interfacing a substrate material, and a second one in which a small amount of outward directed substance is interfacing a material not being part of the substrate. For the second case it is still true that where a volume of the substrate is defined, the insulation layer is buried in this volume, meaning that it is interfacing a substrate material everywhere in this volume. A small volume of the substrate may be removed such that another material is substituting the substrate material, e.g. air in a cavity formed in the substrate. In the context of the present invention, an insulation layer may be considered as being substantially buried in a substrate if the perimeter of the insulation layer is sandwiched within the substrate at both sides. In particular embodiments, an insulation layer may be considered as being substantially buried in a substrate if more than 50%, for instance more than 80% of its outward directed substance is interfacing a substrate material.

An embodiment in accordance with a first aspect of the invention is now described with reference to FIG. 1, which is showing a schematic cross-sectional view of a circuit 100 suitable for sensing a current. The circuit 100, which is preferably an integrated circuit, comprises a substrate 110 which may be coupled to a current conductor 101. Two major surfaces 116, 117, opposite to each other, are defined for the substrate 110. A first major surface 116 of the substrate 110 may be a top surface, and the second major surface 117 may be the bottom surface of the substrate 110. On, on top, or in the first major surface 116, at least one magnetic field sensing element 113 is arranged at a straight distance 109 from the current conductor 101, provided that the current sensing circuit 100 is properly mounted thereon. The second major surface 117 may then be physically coupled to the current conductor 101; for the example shown in FIG. 1, a portion of the bottom side of the substrate 110 is attached to the current conductor 101 via an attachment layer 103. A first insulation layer 112 is substantially buried inside the substrate 110. For this particular embodiment, the first insulation layer 112 is completely buried in the substrate 110, meaning that the first insulation layer 112 is positioned between the first and the second major surfaces 116, 117 such that it is interfacing a substrate material 111, 115 on either side.

Without being limited to an embodiment as shown in FIG. 1, a current conductor 101 may be a portion of leadframe which provides the input and output terminals to the current sensing circuit 100, e.g. input and output access to a standard packaged integrated circuit, such as QFN, SOIC, etc., which are surface mountable to a printed circuit board and have a small footprint. The leadframe may be implemented in copper, but other metals suitable for conducting a current are also usable. For example, the current conductor 101 may be formed as a primary portion of the leadframe, a secondary and other portions of the leadframe being electrically insulated from the primary portion for the packaged circuit. In some embodiments of the invention, the leadframe comprises a plurality of leads in both a primary portion and a secondary portion 102, and a current conductor 101 may be obtained by electrically connecting at least two of these leads belonging to the primary portion. This has the advantage that a contacting surface can be increased such that ohmic losses at this contact surface are minimized. It also reduces local heating of the contacting leads that form the current conductor 101 and leads to a lower risk of heat induced failure of the current sensing circuit 100. Especially in the case of miniaturized, integrated current sensing circuits, high current densities are the result of reduced cross-sectional areas of the leads or the current conductor inside the integrated circuit and elevated currents that are to be measured, e.g. currents higher than 1 A, higher than 30 A, higher than 50 A, higher than 100 A, even up to 200 A, e.g. currents between 1 A and 150 A, such as between 1 A and 50 A. The current conductor 101 may be physically coupled to the substrate 110 in a direct or an indirect manner. For some embodiments of the invention, an indirect coupling may be provided by means of an attachment layer 103 as shown in FIG. 1. A non-limiting example of an attachment layer 103 may be or may comprise an insulating tape, an adhesive film, an adhesive polymer film, or glue. In embodiments of the invention for which leads belonging to the secondary portion 102 of the leadframe are used as output terminals, of which FIG. 1 is an example, the at least one magnetic field sensing element 113 is electrically coupled to one or more leads of the second portion 102 of the leadframe. A suitable electrical coupling may be achieved by providing one or more bond pads 114 on the first major surface 116 of the substrate 110 and wire-bonding them, with a thin wire connection 105, e.g. a thin gold wire, to the one or more leads belonging to the secondary portion 102. Long wire connections 105 are feasible such that the substrate 110 is only resting on the primary portion of the leadframe and therefore does not need to overlap, in a plan view parallel to the first major surface 116, with a secondary portion 102 of the leadframe. Therefore smaller, more compact substrates 110, e.g. smaller area semiconductor dies, may be used for an integrated current sensing circuit which decreases the manufacturing cost per device. Moreover, it is possible to maintain a longer distance between the primary and the secondary portion of the leadframe which improves the insulation properties of the circuit 100, for example larger clearance and creepage distances. The one or more bond pads 114 are typically connected to outputs of signal processing circuitry on the active side of the sensor substrate (e.g. semiconductor die) for further processing a signal transduced by the at least one magnetic field sensing element 113. The circuit 100 is typically an integrated, packaged one, meaning that the substrate 110, the leadframe, and possible electrical connections between the substrate 110 and the secondary portion 102 of the leadframe are encapsulated into a housing 104. A housing 104 may be provided as a hardened polymer, e.g. a solidified thermoset polymer in an injection molding process for which the substrate 110, the leadframe, and possible electrical connections between the substrate 110 and the secondary portion 102 of the leadframe are placed into a molding cavity. Such a housing 104 confers additional structural strength to the circuit 100, protects the electronics from contaminants like moisture, dust particles, etc., and also protects the user of possible harm. The housing also results in higher insulation and increases the creepage and clearance compared to a similar case where the housing would not be present. For improved heat dissipation in high current sensing applications, the entire leadframe, or only a portion thereof, may be exposed to a surrounding medium at the bottom of the housing 104, e.g. may be exposed to air or to a heat sinking metal or paste, and may additionally be made thicker to better resist the heat generated therein. However, the encapsulation of the circuit into a housing 104 is only an optional feature of the invention and does not have to be present in other embodiments.

The substrate 110 typically has a flat and thin body. The substrate may be a semiconductor-on-insulator, for instance a silicon-on-insulator substrate. The substrate may for instance have a thickness of less than 12 µm, e.g. less than 10 µm, such as less than 6 µm. Of course, the actual thickness of the substrate 110 depends on the thickness of the buried insulation layer, hence of the intended application of the device. A thin substrate reduces the straight distance 109 between the at least one magnetic field sensing element 113 and the current conductor 101, which increases the signal seen by the current sensing circuit 100. In general, the substrate 110 is provided as a semiconductor substrate, e.g. a die cut from a wafer. For example, silicon or germanium substrates, or other suitable semiconductor substrates may be selected for the substrate 110. Providing the substrate 110 as a semiconductor die as the result of a wafer process is an attractive solution in terms of mass manufacturing capabilities, repeatability, reliability, and manufacturing costs. The substrate 110 includes a first insulation layer 112, which is substantially incorporated into its body volume, and is typically required to have a high degree of purity, smooth material interfaces, and to be free of defects. Non-limiting examples of a buried, first insulation layer 112 are nitride or oxide layers of a semiconductor material, e.g. a silicon oxide layer or a silicon nitride layer. A substrate material 111, 115 on either side of the first insulation layer 112 may be the same material, e.g. crystalline silicon, or may be a different material or the same material in a different phase, e.g. the top silicon 115 may have a stronger dopant concentration than the lower silicon 111, or the top silicon 115 may be amorphous, whereas the lower silicon 111 is crystalline. Moreover, the top surface of the upper substrate material 115 is typically modified in some areas so as to implement electronic circuits in it. The lower substrate material 111 may be thinned in some embodiments of the invention, for instance, if the substrate 110 is a semiconductor die of a wafer, the wafer may undergo a wafer back-thinning process, e.g. by grinding and etching, so as to reduce the material thickness at a wafer back side, thus reducing the final thickness of the semiconductor die. One example of a substrate 110 including a first insulation layer 112, as shown in FIG. 1, may be a germanium-on-insulator or silicon-on-insulator substrate. An exemplary silicon-on-insulator substrate may be obtained by a controlled oxygen ion implantation process followed by an annealing step, by direct re-growth of a thin silicon layer on an oxidized silicon layer using seeding techniques, by wafer bonding techniques using, for instance, surface oxidized silicon wafers bonded onto a silicon handling wafer, etc. Therefore, the first insulation layer 112 may be implemented and substantially buried in a dielectric material that withstands high voltages without breakdown, e.g. a silicon oxide layer. Particularly miniaturized, e.g. small form factor integrated current sensing devices, are increasingly confronted with the problem of increased current densities which lead to elevated operative voltages (e.g. more than 1.5 kV, e.g. at least 3 kV) under which the current sensing device still has to function in a reliable and safe way. Even a thin first, substantially buried insulation layer 112 is providing a substantial degree of insulation of the current sensing circuit 100 with respect to the high operating voltage ranges (e.g. up to 3 kV or more) in the current conductor 101 if it is formed as a dielectric material layer with high electrical breakdown voltage characteristics, e.g. a defect-free, crack-free, and uniform buried silicon oxide layer. Therefore, an electrical breakdown voltage for the current sensing device is determined by the insulating properties of the first insulation layer which insulates from each other the first major surface 116 and the second major surface 117. An insulating property which is typically reported is the breakdown voltage, which, in the present case of a substantially buried insulation layer, depends on the insulation layer dielectric material, density, quality, thickness, interfaces, etc. Besides, the first insulation layer 112 is efficiently blocking possible leakage currents extending into the substrate 110 from its second major surface 117, e.g. its bottom side. Leakage currents may be caused by aging, temperature induced stresses, microcracks during packaging, the application of overrated voltages at the current conductor 101, etc.

In embodiments of the invention, the at least one magnetic field sensing element 113 may be a sensing element based on the Hall-effect, e.g. planar or vertical Hall plates of variable shape, such as circular, wedged, polygonal, etc. The at least one magnetic field sensing element 113 may be implemented in different materials, e.g. Si, Ge, GaAs, InGaAs, InSb, InAs, InP, other materials from the III-V compound semiconductor group, or any other suitable material. It could be deposited by using micro-transfer printing techniques in some embodiments of the invention. Yet, alternative, non-limiting choices for the at least one magnetic field sensing element 113 are offered by magnetotransistors or magnetoresistive sensing elements exploiting the giant magnetoresistance (GMR), the colossal magnetoresistance (CMR), the tunnel magnetoresistance (TMR), the extreme magnetoresistance (xMR), or the anisotropic magnetoresistance (AMR) of some materials. One or more magnetic field sensing elements 113 provided as a foreign material may be transferred, e.g. by printing, or attached to the first major surface 116 and electrically connected to electronic circuits also formed on the first major surface 116 of the substrate 110, e.g. on the first major surface 116 of a semiconductor substrate. Magnetic flux concentrating layers may be locally applied in some embodiments of the invention. These flux concentrators are typically applied to the first major surface 116 of the substrate 110, in vicinity to the at least one magnetic field sensing element 113 so as to locally concentrate the magnetic flux density in this region. This advantageously increases the sensitivity and signal-to-noise ratio of the current sensing circuit 100. Magnetic flux concentrating layers, e.g. layers of ferromagnetic materials, may also be used to redirect magnetic field lines in close proximity to the at least one magnetic field sensing element 113 so as to optimize its relative position to the magnetic field lines generated by the current conductor 101, and therefore optimize its responsivity, e.g. so as to have magnetic field lines traversing a planar Hall plate sensing element in near ninety degree angles. More than one magnetic field sensing element 113 may be arranged on the first major surface 116, for example two or three magnetic field sensing elements may be provided, so as to enable differential measurements between almost identical magnetic field sensing elements. This is advantageous for calibration and accuracy of the current sensing circuit 100 as external magnetic fields, interfering with the generated magnetic field during the current measurement, can now be compensated for.

In operation, a current source, or a voltage source inducing a current flow, is connected to the current conductor 101, e.g. via leads belonging to the primary portion of the leadframe. The current flowing through the current conductor 101 generates a constant or varying magnetic field, depending on whether the current flowing is a constant current or an alternating current. This magnetic field is characterized by magnetic field lines that wind in loops around the current conductor 101, thus extending into regions of the substrate 110 away from the current conductor 101. The at least one magnetic field sensing element 113 detects the magnetic field generated and transduces it into an electrical signal, e.g. a voltage signal, whose amplitude is proportional to the magnetic field strength under non-saturating conditions. A transduced electrical signal may be directly output from the magnetic field sensing element 113, e.g. by directing it to one or more leads of the secondary portion 102 of the leadframe via suitable bond pads 114, wire connections 105, etc., or may be processed before being output. Processing steps may be carried out by suitable signal processing circuitry, which is also formed in the substrate 110, e.g. the semiconductor substrate, and which is adjacent to the magnetic field sensing element 113 to which it is connected. Pre-amplification, filtering, analog-to-digital conversion, modulation/demodulation, chopping, multiplexing/demultiplexing, sample/hold, averaging, correlated double sampling, output conversion to PWM signals, ratiometric signals, or encoded signal suitable for transmission in accordance with a protocol, etc., all constitute examples of processing steps.

Figure 2:
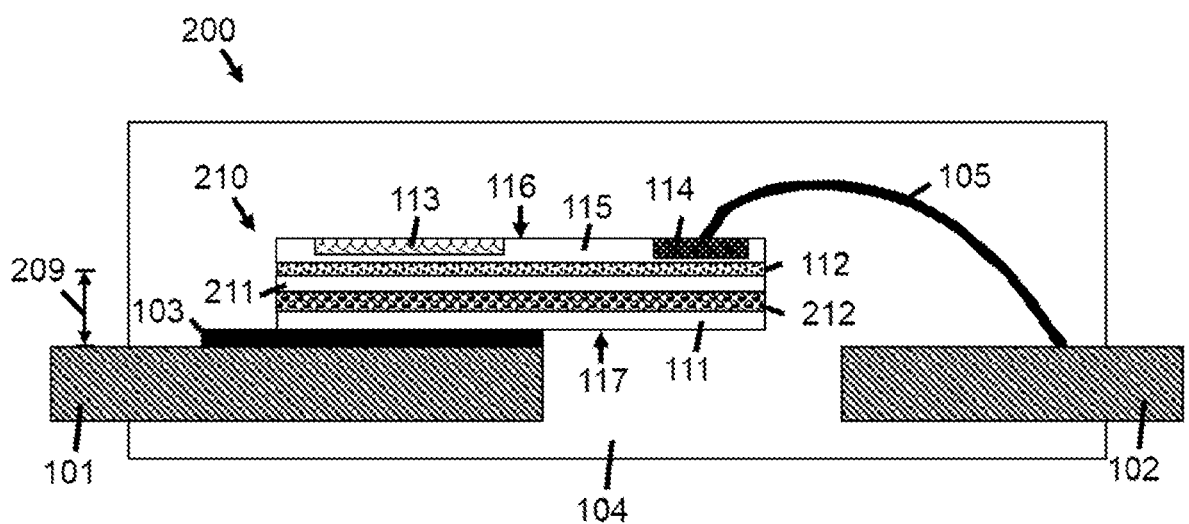
FIG. 2 illustrates an embodiment of the invention which includes two insulation layers, which are both substantially buried inside a substrate and not in direct contact with each other.

FIG. 2 illustrates an embodiment of the invention which includes first and second insulation layers 112, 212, not in direct contact with each other and completely buried inside a substrate 210 of a circuit 200, e.g. an integrated sensor die. Substrate materials 111, 211, 115 on either sides of the two insulation layers 211, 212 may be the same, e.g. a semiconductor material, e.g. silicon, or may differ, e.g. a silicon bottom and intermediate material 111, 211, and a germanium top material 115, or may be similar but of different phases or doping levels. The first and second insulation layers 112, 212 may be buried oxide or nitride layers of a substrate material, e.g. buried silicon oxide or silicon nitride layers. As an example, two buried silicon oxide layers in a silicon substrate may be obtained by oxygen ion implantation on both sides of the silicon substrate, i.e. on its first and second major surfaces 116, 117, followed by an annealing step. A straight distance 209 from the current conductor 101 to the at least one magnetic field sensing element 113 of substrate 210 may be the same as the straight distance 109 with regard to substrate 110, may be reduced, or may be increased. A straight distance 209 may be reduced so as to increase the magnetic field strength at the at least one sensing element 113, and hence the sensitivity of the current sensing circuit 200. This reduction may not negatively impact the insulating properties between the two major surfaces 116, 117 of the substrate 210, as the second insulation layer 212 provides reinforced electrical insulation. For this particular embodiment, an electrical breakdown voltage for the current sensing device is not solely determined by the insulating properties (e.g. electrical breakdown voltage) of the first insulation layer 112, but also by the insulating properties of the at least one second insulation layer 212. As an example of reinforced electrical insulation, one may consider the case of partial discharges negatively affecting the insulating properties of a substantially buried, second insulation layer 212. The presence of the first insulation layer 112 then still guarantees good electrical insulation with respect to a strong potential difference (e.g. 1.5 kV or more, e.g. up to 3 kV) between the two functional major surfaces 116, 117—one being coupled to the high voltage current conductor 101, the other one carrying the sensitive low voltage electronic circuits. A straight distance 209 may be increased for current sensing applications for which the generated magnetic field strength are well above a detection limit, e.g. sensing high electrical currents exceeding 10 A, e.g. currents up to 100 A (rms) and 150 A (peak). Then the reinforced insulation of the substrate 210 may be increased by providing thicker insulation layers 112, 212, at the expense of lowering the sensitivity of the integrated circuit by a small amount. In all of the embodiments of the invention, an additional external insulation layer may be applied between the current conductor 101 and the substrate 110, 210 for obtaining supplementary insulation, e.g. an externally applied insulation layer comprised by an attachment layer 103, e.g. an insulating tape. A particular advantage of providing two insulation layers 112, 212 and an intermediate substrate material 211 placed between them is that the intermediate substrate material 211 can be electrically grounded, e.g. by TSV connections providing conductive channels through one or both insulation layers. This means that, even in the event of failure of the second insulation layer 212, leaking charges that accumulate at an interface between the intermediate substrate material 211 and the first insulation layer 112 can be efficiently removed whereby a risk of electrical shock or damage of the current sensing circuit 200 is greatly reduced.

Figure 3:
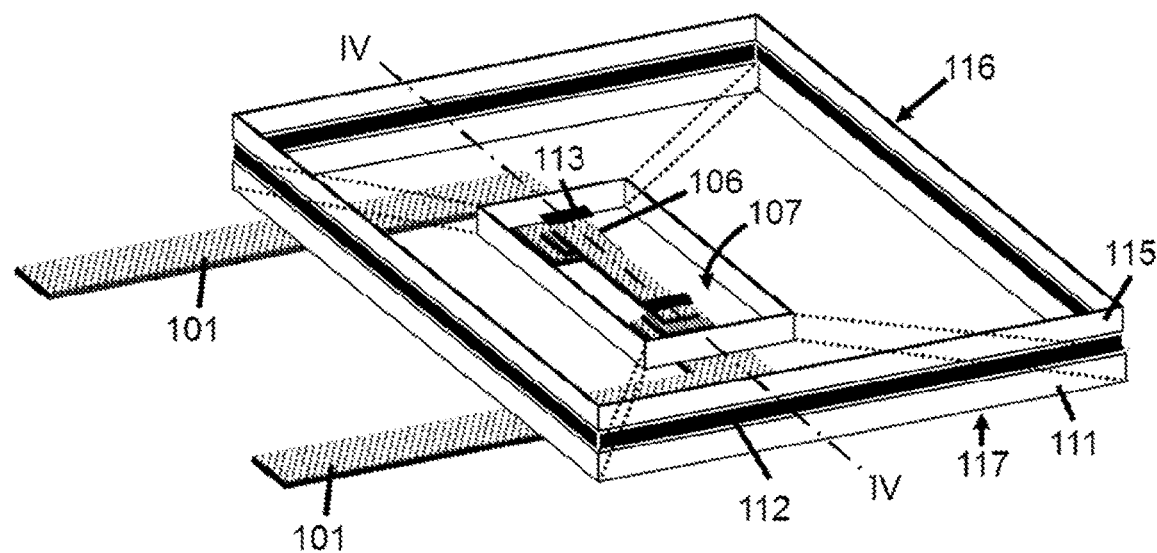
FIG. 3 is a schematic perspective view of a part of an integrated current sensing circuit in accordance with an embodiment of the invention, wherein a cavity is formed at the second major surface.
Figure 4:
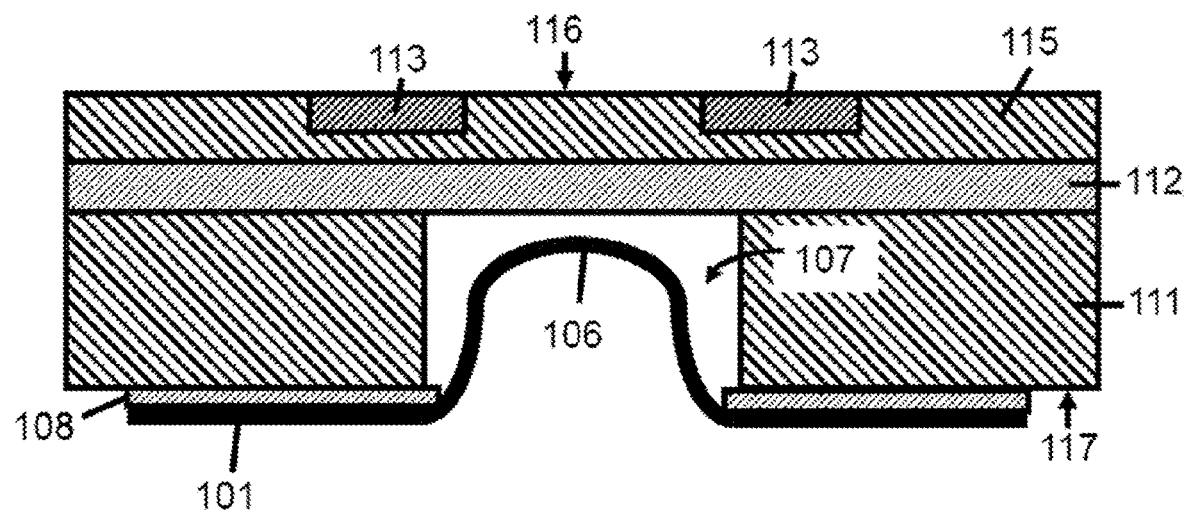
FIG. 4 is a schematic cross-section along the line IV-IV of the embodiment shown in FIG. 3, wherein the cavity has straight side walls.

FIG. 3 is a schematic perspective view of a part of a current sensing circuit, e.g. an integrated circuit, and FIG. 4 is a schematic cross-section (along the line IV-IV) thereof. The numerous details brought forth in FIG. 3 and FIG. 4 have already been described in respect of foregoing embodiments, except for a protruding section 106 of the current conductor 101 and for a cavity 107 formed at the second major surface 117 of the substrate. Forming a cavity 107 in vicinity of the at least one magnetic field sensing element 113 has the advantage of locally thinning the substrate whereby a straight distance 109, 209 between the current conductor 101 and the at least one magnetic field sensing element 113 is reduced, which increases the signal seen by the current sensing integrated circuit. An alternative way of thinning the substrate and reducing a straight distance 109, 209 between the current conductor 101 and the at least one magnetic field sensing element 113 is the partial, removal of substrate material 111 at the second major surface 117 of the substrate, e.g. by grinding, polishing, etching, etc. For embodiments in which the substrate is provided as a semiconductor die, this may be achieved in a wafer back side thinning process. The formation of the cavity 107 has the advantage that the reduction of a substrate thickness is only obtained locally, whereas the remainder of the substrate is unaffected and ensures the structural integrity of the substrate as a whole, e.g. avoids breaking or cracking of the already thin substrate during handling, assembly, and stress tests. In some embodiments of the invention, the cavity 107 is formed such that the at least one first insulation layer 112 is partially exposed at the bottom of the cavity 107 and accessible through the second major surface 117. Yet, the first insulation layer 112 is still substantially buried in the remaining volume of the substrate. In cases for which there is more than one, e.g. more than the first insulation layer 112 in the substrate, i.e. there exists at least a second insulation layer 212, the insulation layer which is located closest to the second major surface 117 may be partially exposed at the bottom of the cavity 107. In other embodiments, the cavity 107 does not reach all the way through the substrate material 111 such that a substantially buried insulation layer is not exposed, e.g. forms a completely buried insulation layer. For some embodiments of the invention, a cavity 107 may be obtained at the second major surface 117 by chemical etching an opening into the substrate material 111, e.g. by dry etching, wet etching, plasma etching, etc. If a dry etching process is used to form the cavity 107, very steep cavity side walls that are substantially forming ninety-degree angles with the second major surface 117 can be obtained.

In preferred embodiments of the invention, the current conductor 101 is formed to have a flat section, e.g. as a flat stripe, extending in a plane parallel to the second major surface 117 whereby a good coupling to the second major surface 117 can be obtained. The protruding section 106 is projecting out of a plane defined by the flat section of the current conductor 101 and is positioned with respect to the substrate such that it extends into the cavity 107. This configuration of the current conductor 101 allows to position the current conductor 101 at an even closer straight distance to the at least one magnetic field sensing element 113. This increases the sensitivity of the integrated circuit without removing or thinning an insulation layer. It also facilitates the positioning of the current conductor 101 with respect to the at least one magnetic field sensing element 113. For a better responsivity and sensitivity of the current sensing circuit, and less offset compensation requirements due to positional asymmetries between the current conductor 101 and one or more magnetic field sensing elements 113, a very accurate and precise positioning of the current conductor 101 during assembly of the current sensing circuit, e.g. at the time of coupling the current conductor 101 to the substrate, is mandatory. Embodiments of the invention which include the cavity 107 and a protruding section 106 have the advantage that the protruding section 106 may be easily locked into the cavity 107 as long as the relative dimensions are selected accordingly.

In some embodiments of the invention, the protruding section 106 of the current conductor 101 may be obtained by means of a stamping tool. In alternative embodiments, the protruding section 106 of the current conductor 101 may be obtained by means of etching an initially thick leadframe, or a thick primary portion, everywhere except for a portion protected from etching which corresponds to the protruding section 106 after finishing the etch.

At the time the integrated circuit is assembled, a thin layer of conductive paste 108 may be provided between the current conductor 101 and the second major surface 117 for some embodiments of the invention, as shown, for instance, in FIG. 4. The conductive paste may be part of the attachment layer 103. A thin layer of conductive paste 108 may improve the overall adhesion of the current conductor 101 with respect to the substrate, and it may also conduct excess heat away from the current conductor. Additionally, a more uniform current flow at a targeted straight distance between the current conductor 101 and the at least one magnetic field sensing element 113 may be the result of a smoother attachment interface, e.g. by smoothing out surface defects and roughness, or non-planar surface portions of the current conductor 101. Therefore, a current can be measured more accurately by the current sensing circuit.

Figure 5:
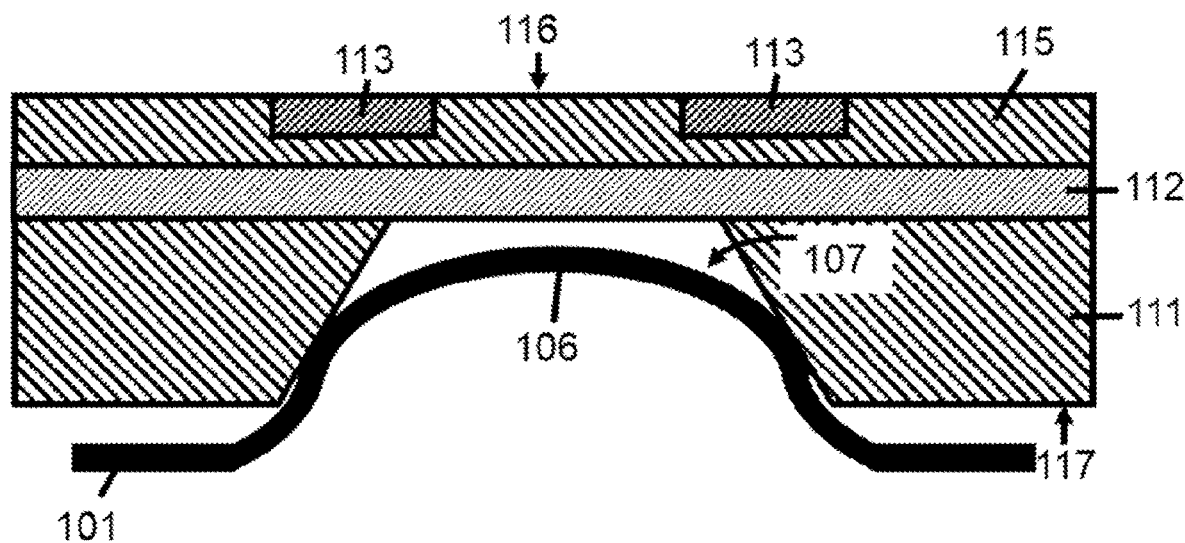
FIG. 5 shows a schematic cross-section similar to the one shown in FIG. 4 but displays a cavity which has chamfered side walls.

FIG. 5 illustrates a cross-section that is similar to the one shown in FIG. 4, but which has chamfered cavity 107 side walls. A cavity 107 having chamfered side walls has a bigger cross-sectional area at the side of the second major surface 117 and a smaller cross-sectional area at its bottom part. This may facilitate even more the introduction of the protruding section 106 into the cavity 107. Furthermore, it is an advantage of a cavity 107 having chamfered side walls that the substrate can rest on and being supported by the primary portion of the leadframe, by virtue of the protruding section 106 abutting on the chamfered side walls of the cavity 107, as illustrated in FIG. 5, without damaging the insulation layer, or more generally damaging the thin membrane comprising thinned substrate material 111, the first insulation layer 112, and other substrate material 115. Damaging the first insulation layer 112 would negatively affect the insulation strength of the substrate and the current sensing circuit (e.g. integrated current sensor) as a whole. In other embodiments of the invention, the substrate may rest on and be supported by the flat section of the current conductor 101, as depicted in FIG. 4, thereby providing a larger and more robust support area.

In some embodiments of the invention, the cavity 107 may be partially or completely filled by a low partial discharge susceptible silicone gel before the substrate is physically coupled, e.g. attached by an attachment layer 103, to the current conductor 101. This is protecting the first insulation layer 112 because silicone acts as an insulator and sealing agent at the same time, preventing moisture and reactants from slowly degrading the one or more substantially buried insulation layers. In a synergic effect, silicone gel also provides good thermal and electrical insulation, and is a good adhesive. Temperature fluctuations at the at least one magnetic field sensing element 113 caused by a heating of the current conductor 101 may require regular re-calibration of the (integrated) current sensing circuit to not impact the accuracy of the current measurement, and therefore, may be avoided by providing good heat sinking means and good thermal insulation of the at the at least one magnetic field sensing element 113. In this respect, the first insulation layer 112, e.g. a buried silicon dioxide layer, may also provide good thermal insulation means.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the indefinite article "a" or "an" does not exclude a plurality. The mere fact that certain measures are recited in mutually different dependent claims does not indicate that a combination of these measures cannot be used to advantage.

The invention claimed is:

1. An integrated sensor die having a first and a second major surface, the second major surface being opposite to the first major surface;
    the integrated sensor die comprising at least one magnetic field sensing element arranged on said first major surface of the integrated sensor die and suitable for sensing a magnetic field caused by a current flow;
    wherein the integrated sensor die comprises a first insulation layer positioned between the first major surface and the second major surface such that it is substantially buried in the integrated sensor die;
    wherein the integrated sensor die comprises a semiconductor-insulator-semiconductor substrate, wherein the insulator forms the first insulation layer and is bounded by a semiconductor material on both sides.

2. The integrated sensor die according to claim 1, further comprising an insulating tape coupled to the second major surface.

3. The integrated sensor die according to claim 1, wherein a thickness of the integrated sensor die is reduced in the vicinity of the at least one magnetic field sensing element.

4. The integrated sensor die according to claim 3, wherein a cavity is formed at the second major surface and in the vicinity of the at least one magnetic field sensing element.

5. The circuit according to claim 4, wherein the cavity comprises chamfered side walls and/or straight side walls.

6. The integrated sensor die according to claim 1, wherein the integrated sensor die further comprises at least one second insulation layer positioned between the first major surface and the second major surface such that it is substantially buried in the integrated sensor die and not touching the first insulation layer.

7. The integrated sensor die according to claim 6, wherein a substrate material of the integrated sensor die is located between the first insulation layer and the second insulation layer and is electrically grounded.

8. A method of manufacturing a device for measuring a current, the method comprising:
    providing an integrated semiconductor sensor die having a first and a second major surface, the second major surface being opposite to said first major surface, and a first insulation layer which is, over at least part of its surface, buried in the integrated semiconductor sensor die between said first and second major surface; and
    providing at least one magnetic field sensing element on the first major surface, the magnetic field sensing element being suitable for sensing current flowing through a current conductor;
    wherein the integrated sensor die comprises a semiconductor-insulator-semiconductor substrate, wherein the insulator forms the first insulation layer and is bounded by a semiconductor material on both sides.

9. The method according to claim 8, further comprising the step of etching a cavity into the integrated semiconductor sensor die, the cavity being etched at the second major surface and in the vicinity of the at least one magnetic field sensing element.

* * * * *